(12) United States Patent
Chen et al.

(10) Patent No.: US 10,937,772 B2
(45) Date of Patent: Mar. 2, 2021

(54) SEMICONDUCTOR PACKAGE AND METHOD FOR MANUFACTURING THE SAME

(71) Applicant: TAIWAN SEMICONDUCTOR MANUFACTURING COMPANY LTD., Hsinchu (TW)

(72) Inventors: Yang-Che Chen, Hsin-Chu (TW); Chen-Hua Lin, Yunlin County (TW); Huang-Wen Tseng, Hsinchu County (TW); Victor Chiang Liang, Hsinchu (TW); Chwen-Ming Liu, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 16/425,354

(22) Filed: May 29, 2019

(65) Prior Publication Data
US 2020/0381409 A1 Dec. 3, 2020

(51) Int. Cl.
| | | |
|---|---|---|
| *H01L 23/495* | (2006.01) | |
| *H01L 25/16* | (2006.01) | |
| *H01L 23/31* | (2006.01) | |
| *H01L 49/02* | (2006.01) | |
| *H01L 23/498* | (2006.01) | |
| *H01L 21/56* | (2006.01) | |
| *H01L 21/48* | (2006.01) | |
| *H01L 21/78* | (2006.01) | |
| *H01L 21/66* | (2006.01) | |

(52) U.S. Cl.
CPC .......... *H01L 25/16* (2013.01); *H01L 21/4857* (2013.01); *H01L 21/561* (2013.01); *H01L 21/568* (2013.01); *H01L 21/78* (2013.01); *H01L 22/14* (2013.01); *H01L 23/3128* (2013.01); *H01L 23/3135* (2013.01); *H01L 23/49816* (2013.01); *H01L 23/49822* (2013.01); *H01L 23/49827* (2013.01); *H01L 28/10* (2013.01)

(58) Field of Classification Search
CPC . H01L 21/568; H01L 21/561; H01L 21/4857; H01L 21/78; H01L 22/14; H01L 23/49816; H01L 23/3128; H01L 23/49827; H01L 23/49822; H01L 23/3135; H01L 25/16; H01L 28/10
USPC ........................................................ 257/668
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |

(Continued)

*Primary Examiner* — Luan C Thai
(74) *Attorney, Agent, or Firm* — WPAT, P.C., Intellectual Property Attorneys; Anthony King

(57) ABSTRACT

A semiconductor package structure includes an interconnection structure having a first surface and a second surface opposite to the first surface, a die surrounded by a molding compound over the first surface of the interconnection structure, and a passive device surrounded by a dielectric structure over the second surface of the interconnection structure. The passive device is electrically coupled to the die by the interconnection structure.

20 Claims, 11 Drawing Sheets

(56) References Cited

U.S. PATENT DOCUMENTS

| | | | |
|---|---|---|---|
| 9,425,126 B2 | 8/2016 | Kuo et al. | |
| 9,443,783 B2 | 9/2016 | Lin et al. | |
| 9,496,189 B2 | 11/2016 | Yu et al. | |
| 9,527,723 B2 * | 12/2016 | Lin | H01L 24/19 |
| 9,818,722 B1 * | 11/2017 | Wang | H01L 24/19 |
| 10,304,800 B2 * | 5/2019 | Chen | H01L 24/17 |

\* cited by examiner

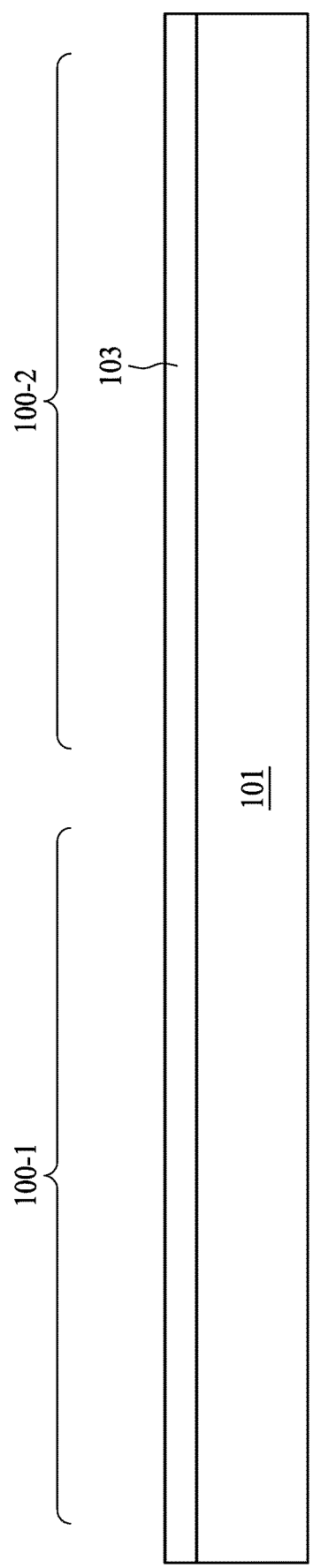

SEMICONDUCTOR PACKAGE AND METHOD FOR MANUFACTURING THE SAME

BACKGROUND

The semiconductor industry has experienced rapid growth, due in part to ongoing improvements in the integration density of a variety of electronic components (e.g., transistors, diodes, resistors, capacitors, etc.). For the most part, improvements in integration density have resulted from iterative reduction of minimum feature size, which allows more components to be integrated into a given area. As the demand for smaller electronic devices has increased, a need for more space-efficient and creative packaging techniques for semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A through 3I illustrate sectional views of a semiconductor package structure at various fabrication stages constructed according to aspects of the present disclosure in one or more embodiments.

DETAILED DESCRIPTION

Figure 1:
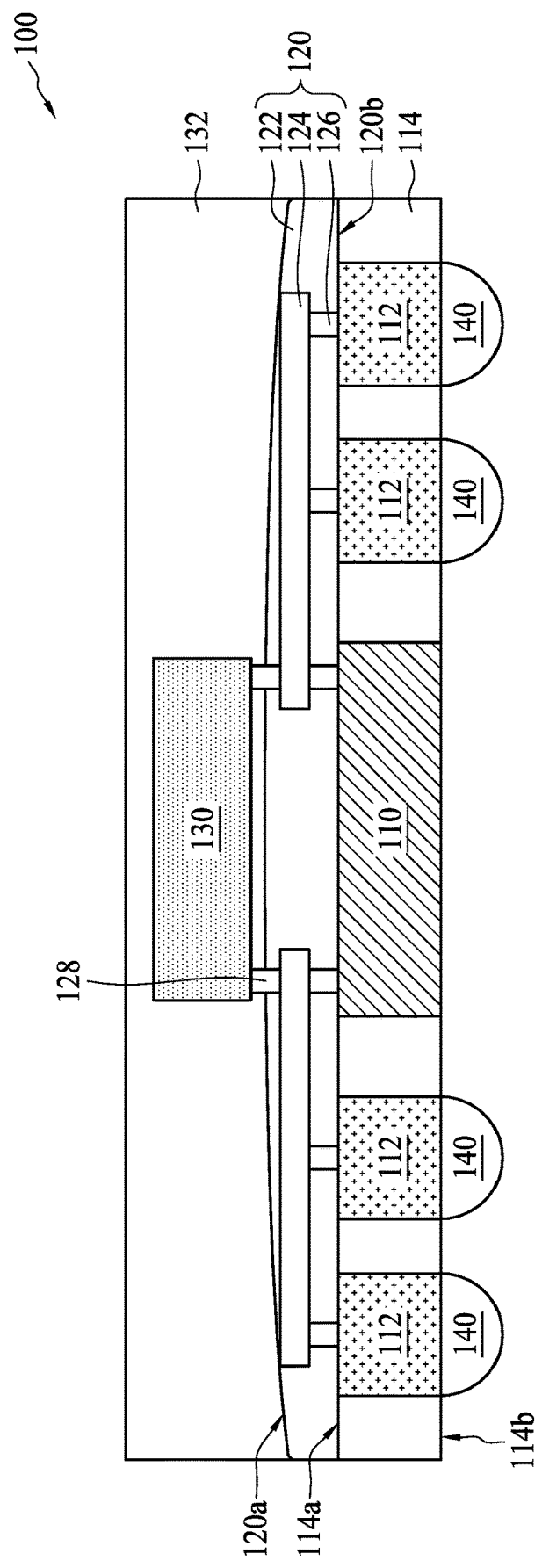
FIG. 1 is a schematic drawing illustrating a semiconductor package structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

One or more implementations of the present disclosure will now be described with reference to the attached drawings, wherein like reference numerals are used to refer to like elements throughout, and wherein the illustrated structures are not necessarily drawn to scale. As used herein, the terms "die" and "chip" are interchangeable throughout the specification.

The terms "wafer" and "substrate" used herein include any structure having an exposed surface onto which a layer is deposited according to the present invention, for example, to form a circuit structure such as a redistribution layer (RDL). The term "substrate" is understood to include semiconductor wafers, but is not limited thereto. The term "substrate" is also used to refer to semiconductor structures during processing, and may include other layers that have been fabricated thereupon.

Embodiments discussed herein may be discussed in a specific context, namely a semiconductor package structure including a passive device such as an inductor. The inductor can be integrated with a power management integrated circuit (PMIC) to form a fully-integrated voltage regulator (FIVR) in some embodiments, but the disclosure is not limited thereto.

In some comparative embodiments, an integrated circuit may be formed in a given area of a wafer, and the inductor is subsequently disposed over the given area and electrically connected to the integrated circuit. An area size of an inductor is usually much greater than an area size of an active region where the corresponding integrated circuit is formed. Therefore, to accommodate such inductor, dummy regions are required over the wafer. The dies (each of which includes an inductor and the corresponding integrated circuit) are then singulated from the wafer, and each die includes an active region for accommodating the corresponding integrated circuit and the dummy regions for accommodating the inductor. The dummy regions occupy much more of the valuable area of the wafer than the active region. In some comparative embodiments, a ratio of a total area of occupied by the dummy regions to a total area occupied by the device region is greater than 10:1, which means a lot of the valuable area of the wafer is wasted.

In some comparative embodiments, the inductors are disposed over the wafer by wafer-level processes. That is, all the inductors are formed on the wafer at the same time. As a result, a qualified inductor may be formed and electrically coupled to an unqualified integrated circuit, or an unqualified inductor may be formed and electrically coupled to a qualified integrated circuit. Consequently, waste occurs. Further, active devices used to form the corresponding integrated circuit may be damaged during the forming of the inductor, thus making the corresponding integrated circuit unqualified. Additionally, due to different coefficients of thermal expansion (CTEs) of the above mentioned elements in the semiconductor package structure, warpage may occur during the manufacturing operations. The warpage is undesirable because it can cause conductive/dielectric interfacial delamination, thus reducing reliability and production yield of the semiconductor package structure.

The embodiments of the present disclosure therefore provide a method for forming a semiconductor package structure to integrate the passive device with a die including active devices. In some embodiments, operations for manufacturing the inductor and operations for manufacturing the die are performed separately. For example, operations are performed to form the dies, including active devices, in a wafer, and the dies are then singulated. Because the wafer is fully utilized to form the dies, no dummy regions are required and waste can thus be reduced. Also, because the operations for manufacturing the inductor and the operations for manufacturing the die are separate, the active devices in the dies can be protected from the unwanted effects of the forming of the inductor. Further, the dies and the inductors can be tested before the die is disposed, and issues related to connection of a qualified inductor to an unqualified die (or vice versa) can thus be mitigated. In some embodiments, the inductor can be formed over a carrier substrate prior to the disposing of the die, therefore warpage control can be improved by selecting a carrier substrate having suitable CTE.

FIG. 1 is a schematic drawing illustrating a semiconductor package structure in accordance with some embodiments of the present disclosure. The semiconductor package structure 100 includes a passive device 110 disposed in and surrounded by a dielectric structure 114, a conductor 112 disposed in and surrounded by the dielectric structure 114, an interconnection structure 120 disposed over the passive device 110, the conductor 112 and the dielectric structure 114, and a die 130 disposed in and surrounded by a molding compound 132. The conductor 112 and the passive device 110 are electrically coupled to the interconnection structure 120. In some embodiments, the conductor 112 can be electrically coupled to the die 130 by the interconnection structure 120. In some embodiments, the interconnection structure 120 includes a first surface 120a and a second surface 120b opposite to the first surface 120a. The die 130 and the molding compound 132 are disposed over the first surface 120a, while the passive device 110, the conductor 112 and the dielectric structure 114 are disposed over the second surface 120b. Significantly, the die 130 and the passive device 110 are electrically coupled to each other by the interconnection structure 120.

In some embodiments, the interconnection structure 120 further includes a dielectric layer 122, a conductive layer 124 disposed in the dielectric layer 122 and a via 126 disposed in the dielectric layer 122. The conductor 112 can be electrically coupled to the conductive layer 124 of the interconnection structure 120 by the via 126. The die 130 is electrically coupled to the interconnection structure 120. In some embodiments, the semiconductor package structure 100 includes a pad 128 disposed between the die 130 and the interconnection structure 120. The die 130 is electrically coupled to the interconnection structure 120 by the pad 128. The dielectric structure 114 has a first surface 114a facing the interconnection structure 120 and a second surface 114b opposite to the first surface 114a. In some embodiments, the conductor 112 extends from the first surface 114a to the second surface 114b and is exposed through the second surface 114b of the dielectric structure 114. In some embodiments, the semiconductor package structure 100 further includes an external connector 140 disposed over the surface of the conductor 112 and the second surface 114b of the dielectric structure 114. The external connector 140 is electrically coupled to the conductor 112.

As shown in FIG. 1, in some embodiments, the dielectric structure 114 is in contact with sidewalls of the passive device 110 and sidewalls of the conductor 112. In some embodiments, a thickness of the passive device 110 is substantially the same as a thickness of the conductor 112, but the disclosure is not limited thereto. In some embodiments, the thickness of the passive device 110 and the thickness of the conductor 112 are substantially the same as a thickness of the dielectric structure 114, but the disclosure is not limited thereto. In some embodiments, the molding compound 132 is in contact with sidewalls of the die 130. In some embodiments, the molding compound 132 can be in contact with a top surface of the die 130. In other embodiments, the top surface of the die 130 can be exposed through the molding compound 132, though such configuration is not shown.

In some embodiments, the die 130 can include a plurality of active devices. In some embodiments, the plurality of active devices can be used to form an integrated circuit. Accordingly, the die 130 can include a power management integrated circuit (PMIC) die, an application specific integrated circuit (APIC) die, or a logic die, but the disclosure is not limited thereto. In some embodiments, the passive device 110 includes an inductor, but the disclosure is not limited thereto.

In some embodiments, the dielectric structure 114 can include a molding compound, epoxy, or a polymer, such as polybenzoxazole (PBO), polyimide (PI) or benzocyclobutene (BCB), but the disclosure is not limited thereto. In other embodiments, the dielectric structure 114 can include oxides such as silicon oxide (SiO), phosphosilicate glass (PSG), borosilicate glass (BSG) or boron-doped phosphosilicate glass (BPSG), but the disclosure is not limited thereto. In some embodiments, when the dielectric structure 114 includes the molding compound, the conductor 112 can serve as a through-molding via (TMV), but the disclosure is not limited thereto. In some embodiments, the conductor 112 includes a metal material such as copper (Cu), titanium (Ti), tungsten (W) or aluminum (Al), but the disclosure is not limited thereto. In some embodiments, the passive device 110 can include the abovementioned metal materials and a magnetic material, but the disclosure is not limited thereto.

Figure 2:
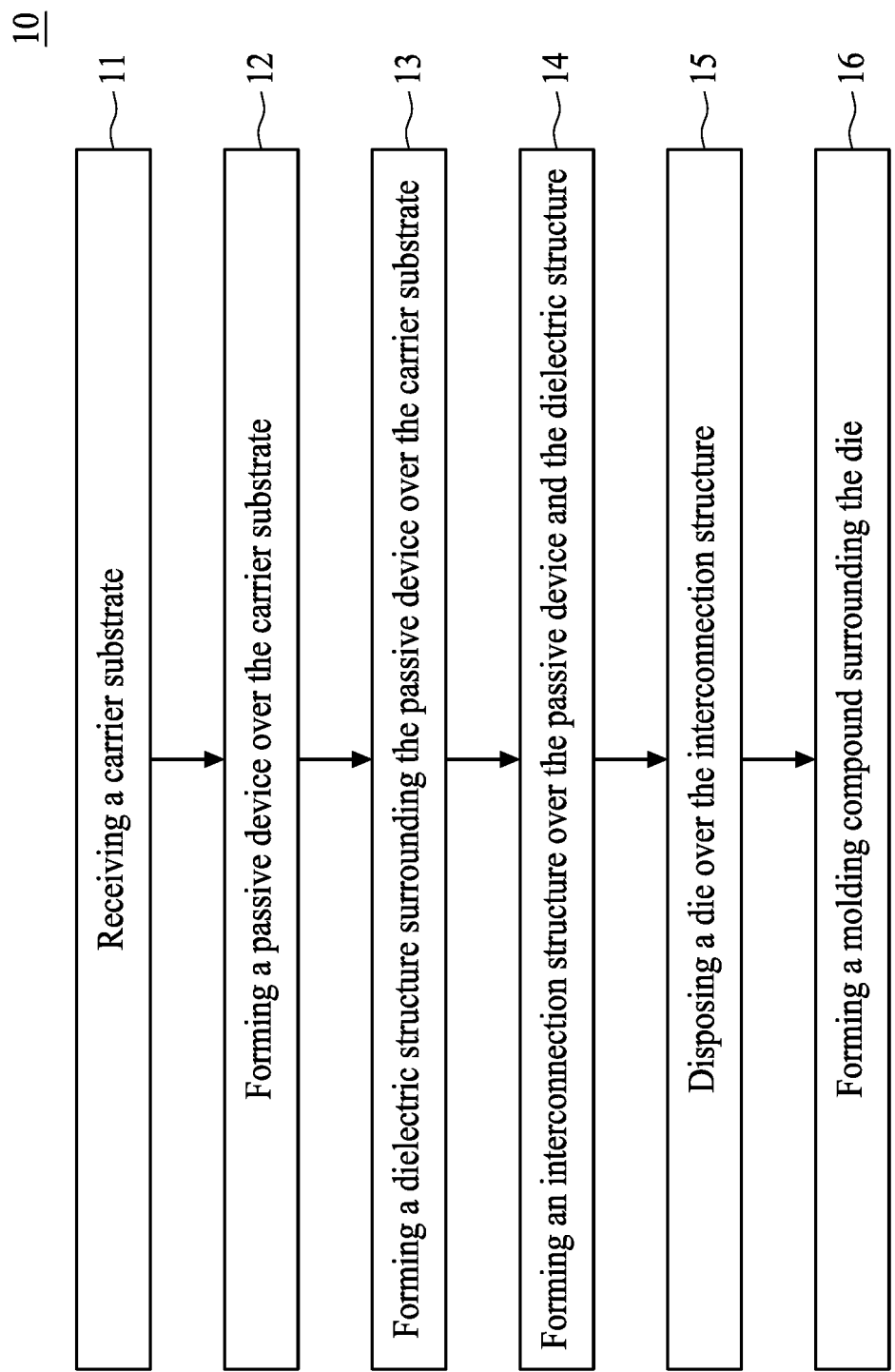
FIG. 2 is a flow diagram representing a method for manufacturing a semiconductor package structure in accordance with some embodiments of the present disclosure.

FIG. 2 is a flow diagram representing a method for manufacturing a semiconductor package structure in accordance with some embodiments of the present disclosure, and FIGS. 3A through 3I illustrate sectional views of a semiconductor package structure at various fabrication stages constructed according to aspects of the present disclosure in one or more embodiments. In some embodiments, a method of forming a semiconductor package structure 10 is provided. The method 10 includes a number of operations (11, 12, 13, 14, 15 and 16).

Referring to FIG. 3A, a carrier substrate 101 can be provided or received in operation 11. The carrier substrate 101 can include a glass carrier substrate, a ceramic carrier substrate, or the like. In some embodiments, the carrier substrate 101 can be selected according to its CTE, and the selection will be detailed in the following description. In some embodiments, a release layer 103 can be formed over the carrier substrate 101. The release layer 103 may be formed of a polymer-based material, which may be removed along with the carrier substrate 101 in subsequent operations. In some embodiments, the release layer 103 is an epoxy-based thermal-release material, which loses its adhesive property when heated, such as a light-to-heat conversion (LTHC) release coating. In some embodiments, the release layer 103 may be an ultra-violet (UV) glue, which loses its adhesive property when exposed to UV light. The release layer 103 can be a liquid that is dispensed and cured, a laminate film that is disposed onto the carrier substrate 101, or another form and method of disposition. A top surface of the release layer 103 can be level and may have a high degree of coplanarity, as shown in FIG. 3A. In some embodiments, package regions 100-1 and 100-2 for manufacturing semiconductor package structures, respectively, can be defined over the carrier substrate 101.

Figure 3B:
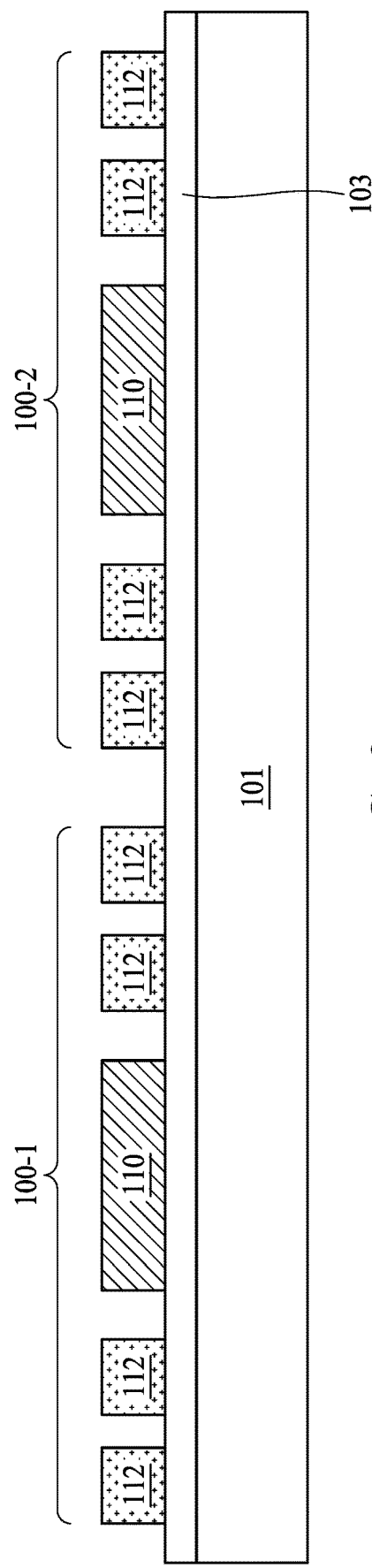

Referring to FIG. 3B, a passive device 110 is formed over the carrier substrate 101 in operation 12. The passive device 110 is formed in each of the package regions 100-1 and 100-2. The passive device 110 can be adhered to the carrier substrate 101 by the release layer 103. In some embodiments, a conductor 112 can be formed over the carrier substrate 101 and adhered to the carrier substrate 101 by the release layer 103 in operation 12, but the disclosure is not limited thereto. In other words, the conductor 112 and the passive device 110 can be formed simultaneously, but the disclosure is not limited thereto. The conductor 112 is formed in each of the package regions 100-1 and 100-2. As mentioned above, the passive device 110 can be an inductor, but disclosure is not limited thereto. In some embodiments, a redistribution layer (RDL) (not shown) can be formed over the carrier substrate 101 and adhered to the carrier substrate 101 by the release layer 103 prior to the forming of the passive device 110 and the conductor 112. In some embodiments, the RDL can include any number of dielectric layers, any number of metallization patterns and any number of vias. In those embodiments, the passive device 110 and the conductor 112 can be formed on and electrically coupled to the redistribution structure, though not shown.

Still referring to FIG. 3B, the conductor 112 and the passive device 110 can be formed by the following operations. For example, a seed layer (not shown) can be formed over the carrier substrate 101. The seed layer can be a metal layer, which can be a single layer or a composite layer including a plurality of sub-layers formed of different materials. In some embodiments, the seed layer includes a Ti layer and a Cu layer over the Ti layer, but the disclosure is not limited thereto. A patterned photoresist can be formed over the seed layer. The patterned photoresist includes openings defining locations, dimensions and shapes of the inductor 110 and the conductor 112. A metal material and a magnetic material can be formed in the openings and on the seed layer to form the inductor 110 and the conductor 112. The metal material and the magnetic material can be formed by plating, such as electroplating or electroless plating, but the disclosure is not limited thereto. Subsequently the patterned photoresist is removed. The patterned photoresist can be removed by a suitable ashing or stripping operation, such as using an oxygen plasma or the like. After the removal of the patterned photoresist, portions of the seed layer from which the conductor 112 and the passive device 110 are absent are removed. The portions of the seed layer can be removed by a suitable etching process, such as wet or dry etching.

Still referring to FIG. 3B, in some embodiments, a thickness of the inductor 110 and a thickness of the conductor 112 are substantially the same. In some embodiments, the thicknesses of the inductor 110 and the conductor 112 can be greater than 15 μm, but the disclosure is not limited thereto. In some embodiments, the thicknesses of the inductor 110 and the conductor 112 can be greater than 20 μm, but the disclosure is not limited thereto. It should be noted that a thicker conductor is preferred because it possesses lower resistance. However, a thick conductor induces more serious warpage during the formation operations. In the comparative embodiments, the thickness of the conductor must to be reduced to be less than 15 μm in order to mitigate the warpage issue, and thus the conductor may suffer from greater resistance. In contrast to such comparative embodiments, the warpage issue can be mitigated by selecting a carrier substrate 101 having a suitable CTE, according to the embodiments of the present disclosure. For example, the carrier substrate 101 having a high CTE can be selected to mitigate warpage induced during the operations for forming the inductor 110 and the conductor 112. Consequently, the thickness of the conductor 112 (and also the inductor 110) can be increased to greater than 20 μm, and the resistance is reduced. In summary, by selecting the carrier substrate 101 having the suitable CTE, the warpage issue can be mitigated, the thicknesses of the conductor 112 and the inductor 110 can be increased and the resistances of the conductor 112 and thus the inductor 110 can be reduced.

Figure 3C:
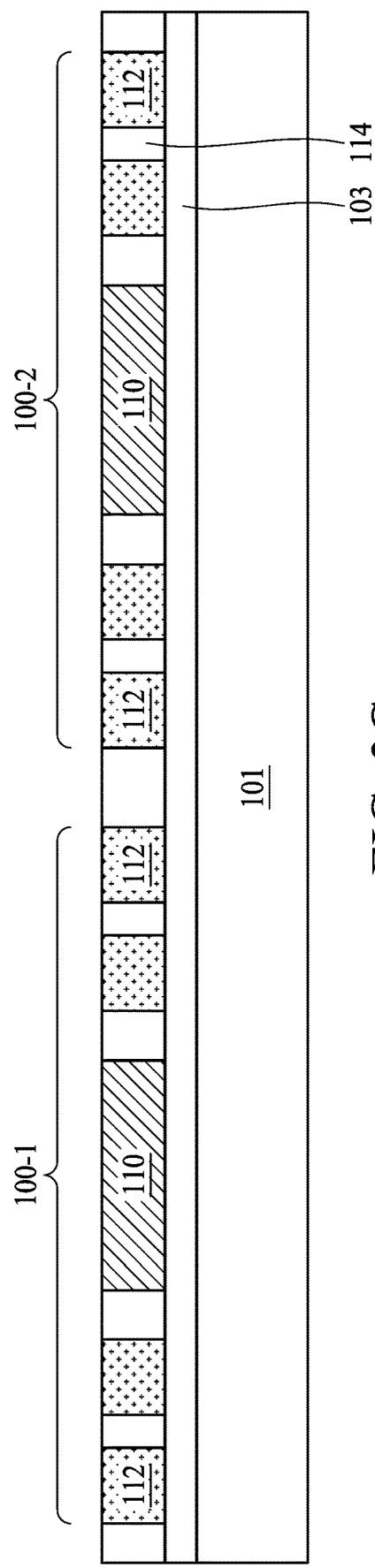

Referring to FIG. 3C, a dielectric structure 114 is formed over the carrier substrate 101 in operation 12. As shown in FIG. 3C, the dielectric structure 114 surrounds the inductors 110 and the conductors 112 throughout the package regions 100-1 and 100-2. As shown in FIG. 3C, the dielectric structure 114 is in contact with sidewalls of the inductors 110 and sidewalls of the conductors 112. In some embodiments, the dielectric structure 114 can include polymer or oxide. In some embodiments, the dielectric structure 114 can include a molding compound, epoxy, or the like, and may be applied by compression molding, transfer molding, or the like. In some embodiments, the dielectric structure 114 can be formed to entirely embed the inductors 110 and the conductors 112. In some embodiments, a grinding operation may performed on the dielectric structure 114 such that top surfaces of the inductors 110 and the conductors 112 are exposed. In some embodiments, the top surfaces of the inductors 110 and the conductors 112 and a top surface of the dielectric structure 114 can be coplanar after the grinding operation, but the disclosure is not limited thereto. In such embodiments, the thickness of the inductors 110, the thickness of the conductors 112 and a thickness of the dielectric structure 114 can be substantially the same, but the disclosure is not limited thereto.

Figure 3D:
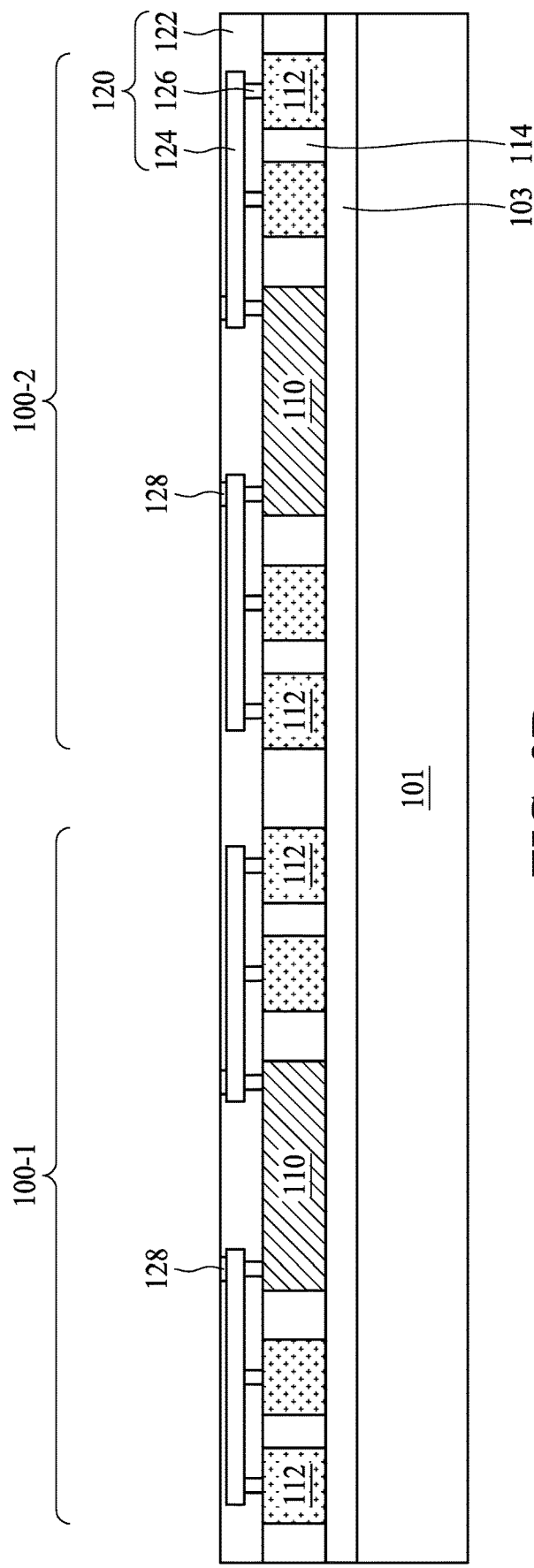

Referring to FIG. 3D, an interconnection structure 120 is formed over the inductor 110, the conductor 112 and the dielectric structure 114 in operation 14. The interconnection structure 120 is formed in each of the package regions 100-1 and 100-2 and is electrically coupled to the inductor 110 and the conductor 112 in each of the package regions 100-1 and 100-2. In some embodiments, the interconnection structure 120 can be a redistribution layer (RDL) formed over and electrically coupled to the inductor 110 and the conductor 112. The interconnection structure 120 can include a dielectric layer 122, a conductive layer 124 disposed in the dielectric layer 122, and a via 126 disposed in the dielectric layer 122. In some embodiments, the conductive layer 124 can be a conductive line electrically coupled to the inductor 110 and the conductor 112 by the via 126. In some embodiments, the interconnection structure 120 can include any number of dielectric layers 122, any number of conductive layers 124 and any number of vias 126. In some embodiments, a pad 128 can be formed over the interconnection structure 120. The pad 128 may be electrically coupled to the interconnection structure 120, as shown in FIG. 3D.

In some embodiments, the dielectric layer 122 can include low dielectric constant (low-k) dielectric material, such as PSG, BPSG, fluorinated silicate glass (FSG), silicon oxy-carbide ($SiO_xC_y$), spin-on-glass, spin-on-polymers, silicon carbon material, compounds, thereof, composites thereof, combinations thereof, or the like. The dielectric layer 122 can be formed on the dielectric structure 114, the inductor 110 and the conductor 112 by any suitable method, such as spinning, chemical vapor deposition (CVD), plasma-enhanced CVD (PECVD), or the like. The conductive layer 124 and the via 126 can include Cu, Cu alloy, other metal alloys, or combinations or multiple layers thereof. The pad 128 can include Cu, Ti, W or Al, but the disclosure is not limited thereto.

Figure 3E:
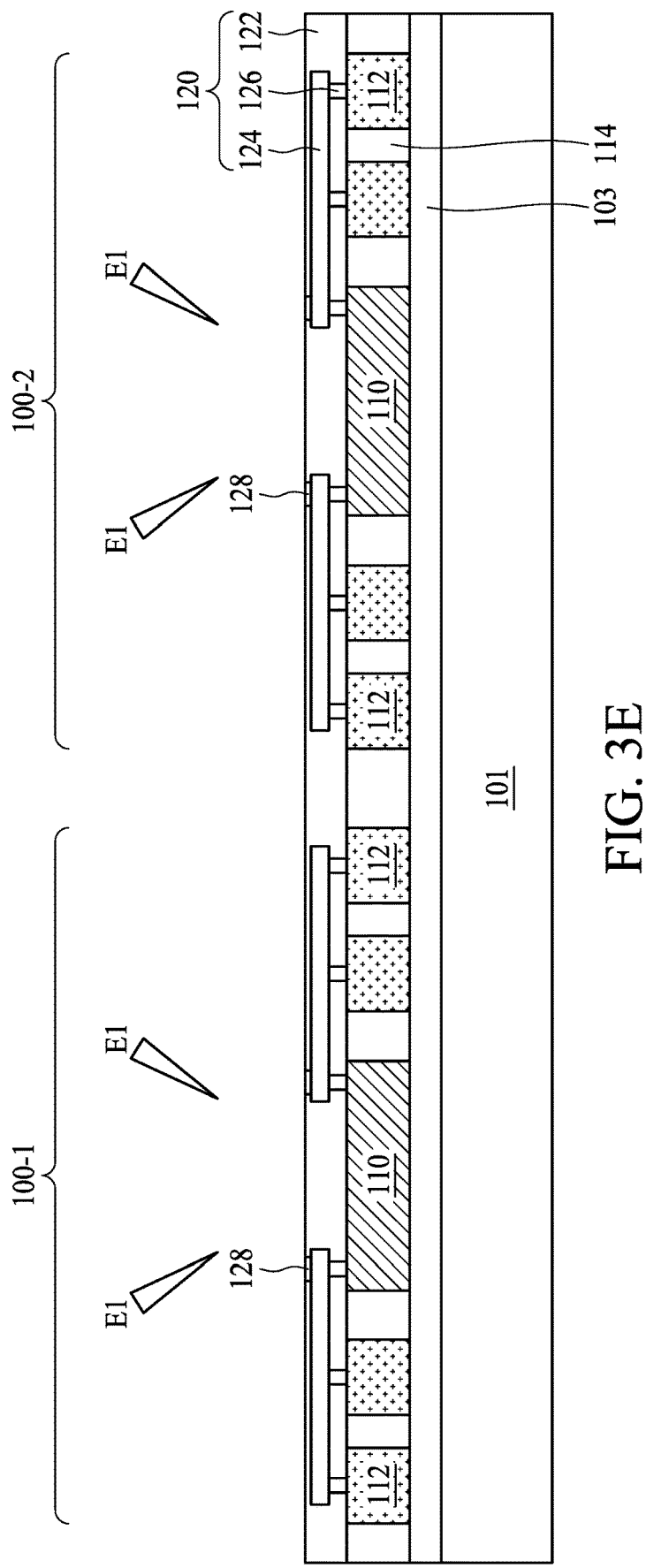

Referring to FIG. 3E, in some embodiments, a test, such as an electrical test E1, can be performed on the inductor 110 through the interconnection structure 120 in each of the package regions 100-1 and 100-2. The electrical test E1 is performed to screen out unqualified passive devices and/or unqualified interconnection structures, but the disclosure is not limited thereto.

Figure 3F:
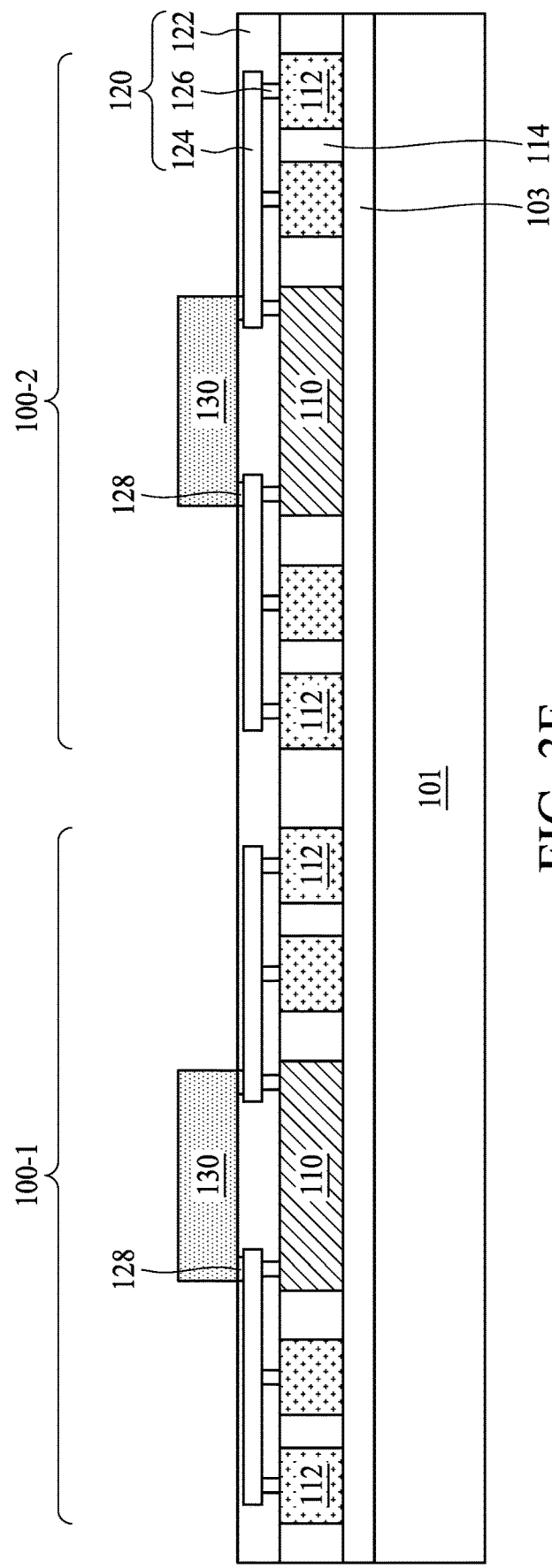

Referring to FIG. 3F, a die 130 is disposed over the interconnection structure 120 in operation 15. The die 103 is disposed in each of the package regions 100-1 and 100-2. In some embodiments, the die 130 can be manufactured in another wafer (not shown) by wafer-level manufacturing operations. In some embodiments, the wafer-level manufacturing operations are performed to form a plurality of active devices in the wafer, and the dies 130 can be singulated from the wafer after the manufacturing operations. Significantly, all available wafer area of the wafer is utilized to form the dies 130, and wafer area waste issues can be mitigated. In some embodiments, the die 130 can be a PMIC die, an APIC die, or a logic die, but the disclosure is not limited thereto.

Additionally, because the die 130 is formed in the wafer without the inductor 110 and the conductor 112, warpage issue and other unwanted effects resulting from the forming of the inductor 110 and the conductor 112 can be mitigated. In some embodiments, the dies 130 can be tested such that an unqualified die can be found. Therefore, it is ensured that a qualified die 130, a qualified interconnection structure 120 and a qualified inductor 110 are used in the forming of the semiconductor package structure.

As shown in FIG. 3F, the die 130 is electrically coupled to the interconnection structure 120. In some embodiments, the die 130 is electrically coupled to the interconnection structure 120 by the pad 128. Consequently, the die 130 and the inductor 110, or the die 130 and the conductor 112 are electrically coupled to each other by the interconnection structure 120.

Figure 3G:
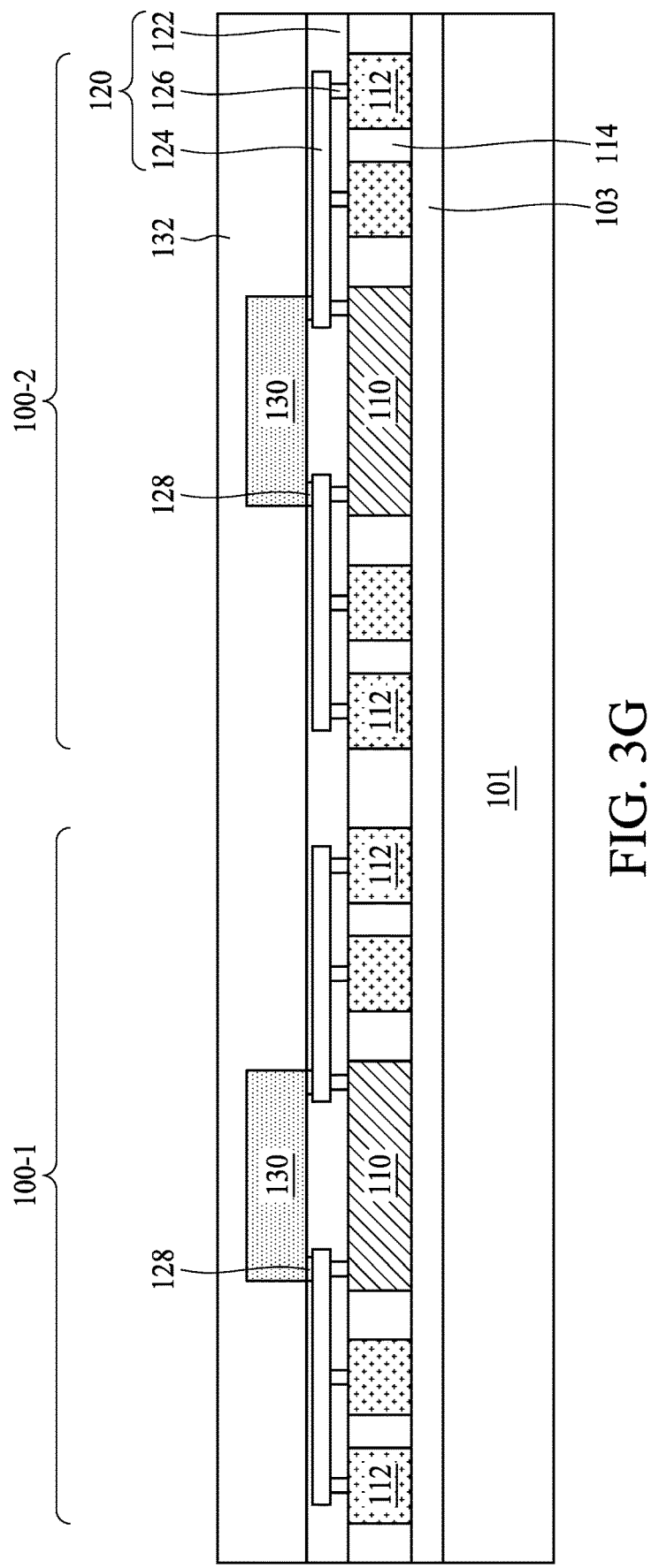

Referring to FIG. 3G, a molding compound 132 is formed over the die 130 and the interconnection structure 120 in operation 16. As shown in FIG. 3G, the molding compound 132 is formed to surround the dies 130 in the package regions 100-1 and 100-2. As shown in FIG. 3G, the molding compound 132 is in contact with sidewalls of the dies 130 and a top surface of the interconnection structure 120. In some embodiments, the molding compound 132 is also in contact with a top surface of the dies 130, but the disclosure is not limited thereto. The molding compound 132 can be applied by compression molding, transfer molding, or the like.

Figure 3H:
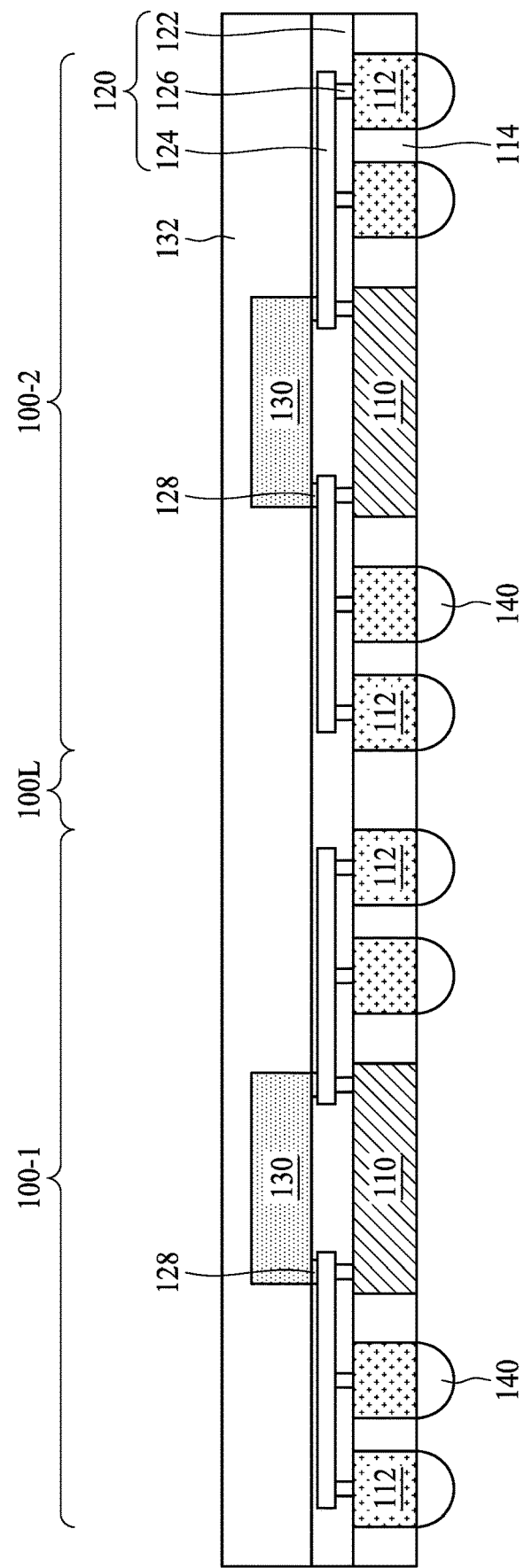

Referring to FIG. 3H, in some embodiments, the carrier substrate 101 is removed to expose a surface of the conductor 112 and a surface of the dielectric structure 114. In other words, an exterior surface of the conductor 112 and an exterior surface of the dielectric structure 114 are exposed after removing the carrier substrate 101. In some embodiments, the structure shown in FIG. 3G can be flipped over and attached to a tape (not shown), such as a dicing tape. The carrier substrate 101 can be removed by a de-bonding operation. In some embodiments, the de-bonding operation includes projecting a light such as a laser light or a UV light on the release layer 103 such that the release layer 103 is decomposed under the heat of the light and the carrier substrate 101 can be removed.

Still referring to FIG. 3H, in some embodiments, an external connector 140 can be formed over the surface of the conductor 112. In some embodiments, a pad (not shown) can be formed on the exterior surface of the conductor 112. The pad is electrically coupled to the conductor 112, and may be referred to as under bump metallurgy (UBM). In some embodiments, a seed layer (not shown) can be formed over the exterior surfaces of the conductor 112 and the dielectric layer 114. In some embodiments, the seed layer is a metal layer, which may be a single layer or a composite layer including a plurality of sub-layers formed of different materials. In some embodiments, the seed layer includes a Ti layer and a Cu layer over the Ti layer. The seed layer may be formed using, for example, PVD or the like. A patterned photoresist (not shown) is then formed on the seed layer. The patterned photoresist can include an opening (not shown) corresponding to the pad. A conductive material is formed in the opening and on the exposed portions of the seed layer to form the pad. The conductive material may be formed by plating, such as electroplating or electroless plating, or the like. The conductive material may include a metal, such as Cu, Ti, W or Al, but the disclosure is not limited thereto.

Subsequently, also in FIG. 3H, the external connector 140 is formed on the UBM. The external connector 140 may be a BGA connector, a solder ball, a metal pillar, a controlled collapse chip connection (C4) bump, a micro bump or an electroless nickel-electroless palladium-immersion gold technique (ENEPIG) formed bump, but the disclosure is not limited thereto. The external connector 140 may include a conductive material such as solder, copper (Cu), aluminum (Al), gold (Au), nickel (Ni), silver (Ag), palladium (Pd), tin (Sn), or a combination thereof, but the disclosure is not limited thereto. In some embodiments, the external connector 140 is formed by initially forming a layer of solder through such commonly used methods as evaporation, electroplating, printing, solder transfer, ball placement, or the like. Once a layer of solder has been formed on the structure, a reflow may be performed in order to shape the material into the desired bump shapes. In another embodiment, the external connector 140 includes a metal pillar (such as a copper pillar) formed by a sputtering, printing, electro plating, electroless plating, CVD, or the like. The metal pillar may be solder free and may have substantially vertical sidewalls.

Figure 3I:
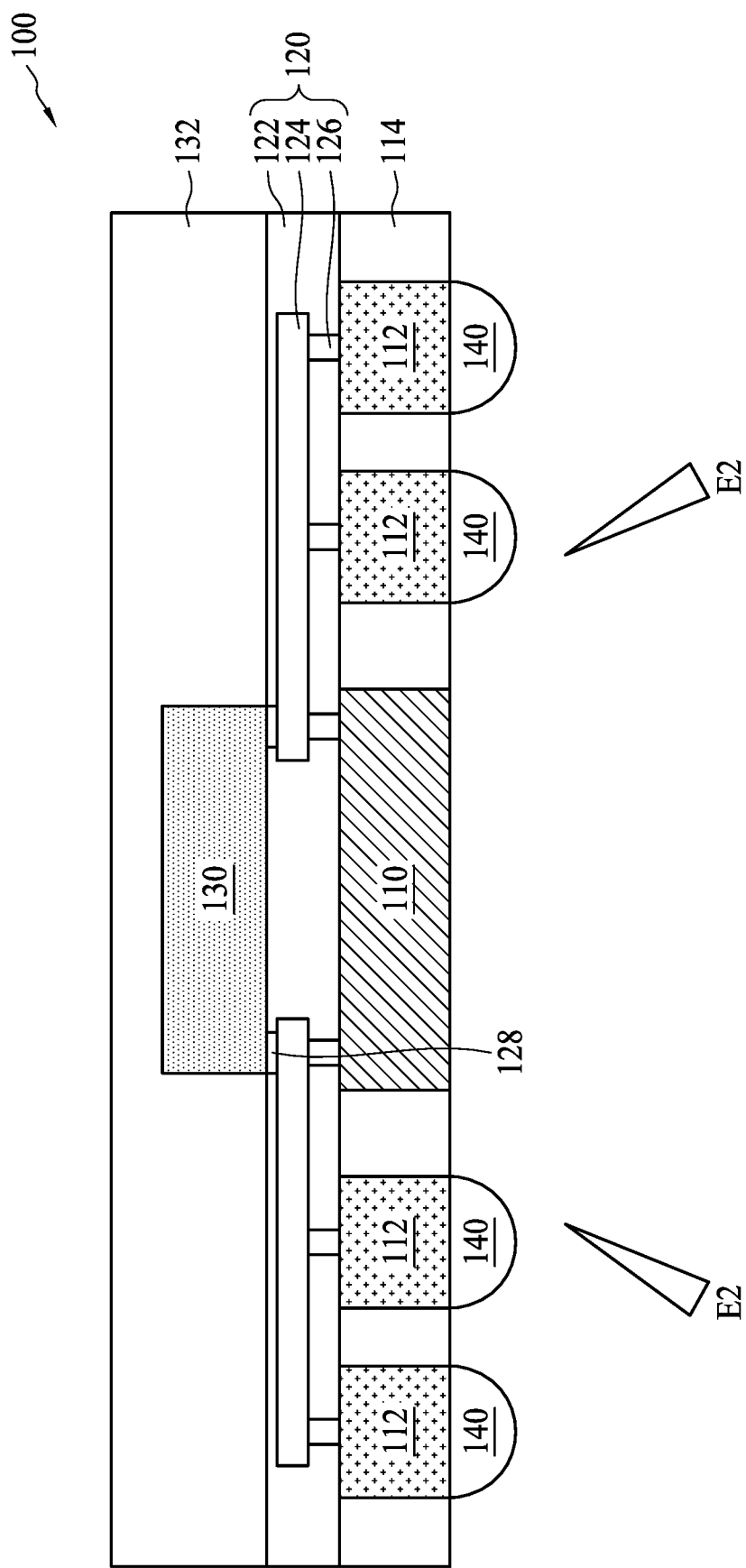

Referring to FIGS. 3H and 3I, in some embodiments, a singulation process is performed by dicing along scribe line regions, e.g., between adjacent package regions 100-1 and 100-2, such as along a line 100L. Dicing saw or laser cutting may be used, in various embodiments. The singulation operation separates the package regions 100-1 and 100-2 from each other, and a plurality of semiconductor package structures 100, such as the semiconductor package structure 100 shown in FIGS. 1 and 3I, is formed. In other words, the dielectric structure 114, the interconnection structure 120 and the molding compound 132 are singulated to form a semiconductor package structure 100 as shown in FIGS. 1 and 3I. In some embodiments, the semiconductor package structure 100 can be a fully-integrated voltage regulator (FIVR), but the disclosure is not limited thereto.

Still referring to FIG. 3I, in some embodiments, a test, such as an electrical test E2, can be performed on the semiconductor package structure 100 through the external connector 140. The electrical test E2 can be performed to screen out an unqualified semiconductor package structure 100, but the disclosure is not limited thereto.

In the present disclosure, by integrating the passive device 110 and the die 130 to form the semiconductor package structure 100, greater integration density and smaller form factor of semiconductor package structure are achieved. Further, because the passive device 110 is formed over the carrier substrate 101 prior to the disposing of the die 130, the warpage issue can be mitigated by selecting the carrier substrate 101 having the suitable CTE. Further, the die 130 can be protected from unwanted effects resulting from the forming of the inductor 110. In some embodiments, because an entire area of the wafer is utilized to form the active devices, no dummy regions are required in a die 130 and thus waste can be reduced. As mentioned above, the inductors 110 can be tested before the die 130 is disposed, and issues related to connections of a qualified inductor to an unqualified die (or vice versa) can thus be mitigated.

In some embodiments, a semiconductor package structure is provided. The semiconductor package structure includes an interconnection structure having a first surface and a second surface opposite to the first surface, a die surrounded by a molding compound over the first surface of the interconnection structure, and a passive device surrounded by a dielectric structure over the second surface of the interconnection structure. In some embodiments, the passive device is electrically coupled to the die by the interconnection structure.

In some embodiments, a semiconductor package structure is provided. The semiconductor package structure includes a first molding compound including a first surface and a second surface opposite to the first surface, an inductor and a through-molding-via (TMV) disposed in the first molding compound, an interconnection structure disposed over the first surface of first molding compound and the inductor, a second molding compound disposed over the interconnection structure, and a die disposed in the second molding compound. In some embodiments, the inductor and the TMV are electrically coupled to the interconnection structure, and the die is electrically coupled to the interconnection structure.

In some embodiments, a method for forming a semiconductor package structure is provided. The method includes receiving a carrier substrate; forming a passive device over the carrier substrate; forming a dielectric structure surrounding the passive device over the carrier substrate; forming an interconnection structure over the passive device and the dielectric structure, wherein the interconnection structure is electrically coupled to the passive device; disposing a die over the interconnection structure, wherein the die is electrically coupled to the interconnection structure; and forming a molding compound surrounding the die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package structure comprising:
    an interconnection structure having a first surface and a second surface opposite to the first surface, wherein the interconnection structure comprises at least a conductive layer and at least a via;
    a die surrounded by a molding compound over the first surface of the interconnection structure;
    a pad between the conductive layer of the interconnection structure and the die;
    a passive device surrounded by a dielectric structure over the second surface of the interconnection structure,
    wherein the passive device is electrically coupled to the die by the interconnection structure, a surface of the die faces a surface of the passive device, and a distance between the surface of the die and the surface of the passive device is equal to a sum of a thickness of the pad, a thickness of the conductive layer and a thickness of the via.

2. The semiconductor package structure of claim 1, wherein the dielectric structure is contact with sidewalls of the passive device.

3. The semiconductor package structure of claim 1, wherein the molding compound is in contact with sidewalls of the die.

4. The semiconductor package structure of claim 1, wherein the passive device comprise an inductor.

5. The semiconductor package structure of claim 1, further comprising a conductor surrounded by the dielectric structure and electrically coupled to the die by the interconnection structure.

6. The semiconductor package structure of claim 5, wherein a thickness of the passive device is substantially the same as a thickness of the conductor.

7. The semiconductor package structure of claim 5, wherein the conductor comprises a metal material.

8. The semiconductor package structure of claim 7, wherein the passive device comprises the metal material and a magnetic material.

9. The semiconductor package structure of claim 5, further comprising an external connector disposed over the dielectric structure and electrically coupled to the conductor.

10. The semiconductor package structure of claim 1, wherein the dielectric structure comprises a molding compound.

11. A semiconductor package structure comprising:
- a first molding compound comprising a first surface and a second surface opposite to the first surface;
- an inductor and a through-molding-via (TMV) disposed in the first molding compound;
- an interconnection structure disposed over the first surface of the first molding compound and the inductor, wherein the interconnection structure comprises at least a conductive layer and at least a via, and the inductor and the TMV are electrically coupled to the interconnection structure;
- a second molding compound disposed over the interconnection structure;
- a die disposed in the second molding compound and electrically coupled to the interconnection structure; and
- a pad between the conductive layer of the interconnection structure and the die,
- wherein a surface of the die faces a surface of the inductor, and a distance between the surface of the die and the surface of the inductor is equal to a sum of a thickness of the pad, a thickness of the conductive layer and a thickness of the via.

12. The semiconductor package structure of claim 11, wherein the first molding compound is in contact with sidewalls of the TMV and sidewalls of the inductor, and the second molding compound is in contact with sidewalls of the die.

13. The semiconductor package structure of claim 11, wherein a thickness of the inductor, a thickness of the TMV and a thickness of the first molding compound are substantially the same.

14. The semiconductor package structure of claim 11, further comprising an external connector disposed over the second surface of the first molding compound and electrically coupled to the TMV.

15. The semiconductor package structure of claim 11, wherein the interconnection structure comprises:
- a dielectric layer,
- wherein the conductive layer and the via are disposed in the dielectric layer, and the via is electrically coupled to TMV.

16. The semiconductor package structure of claim 11, wherein the die is electrically coupled to the interconnection structure by the pad.

17. A method for forming a semiconductor package structure, comprising:
- receiving a carrier substrate;
- forming a passive device over the carrier substrate;
- forming a dielectric structure surrounding the passive device over the carrier substrate;
- forming an interconnection structure over the passive device and the dielectric structure, wherein the interconnection structure is electrically coupled to the passive device;
- disposing a die over the interconnection structure, wherein the die is electrically coupled to the interconnection structure;
- forming a molding compound surrounding the die; and
- singulating the dielectric structure, the interconnection structure and the molding compound to form a semiconductor package structure,
- wherein a pair of sidewalls of the dielectric structure, a pair of sidewalls of the interconnection structure and a pair of sidewalls of the molding compound of the semiconductor package structure are aligned with each other.

18. The method of claim 17, further comprising forming a conductor simultaneously with the forming of the passive device.

19. The method of claim 18, further comprising:
- removing the carrier substrate to expose a surface of the conductor; and
- forming an external connector over the surface of the conductor.

20. The method of claim 19, further comprising:
- performing a first test on the passive device through the interconnection structure; and
- performing a second test on the semiconductor package structure through the external connector.

* * * * *